United States Patent [19]

Kazama et al.

[11] Patent Number: 5,798,655

[45] Date of Patent: Aug. 25, 1998

[54] CONTACT PROBE UNIT INCLUDING NEEDLE MEMBERS URGED BY A RESILIENT MATERIAL BLOCK

[75] Inventors: Toshio Kazama; Kenji Nanseki, both of Nagano-ken, Japan

[73] Assignee: NHK Spring Co., Ltd., Japan

[21] Appl. No.: 812,891

[22] Filed: Mar. 10, 1997

Related U.S. Application Data

[63] Continuation of Ser. No. 356,437, Dec. 15, 1994, abandoned.

[30] Foreign Application Priority Data

Dec. 17, 1993 [JP] Japan .................................. 5-343792

[51] Int. Cl.⁶ .................................................. G01R 31/02
[52] U.S. Cl. .................................................. 324/761
[58] Field of Search ........................ 324/754–764; 437/8; 428/209; 156/643

[56] References Cited

U.S. PATENT DOCUMENTS

| | | | |
|---|---|---|---|
| 4,571,542 | 2/1986 | Arai | 324/537 |
| 4,735,847 | 4/1988 | Fujiwara et al. | 428/209 |
| 4,820,376 | 4/1989 | Lambert et al. | 156/643 |
| 5,132,058 | 7/1992 | Suyama et al. | 264/437 |
| 5,157,325 | 10/1992 | Murphy | 324/158 |
| 5,206,585 | 4/1993 | Chang et al. | 324/754 |
| 5,219,765 | 6/1993 | Yoshida et al. | 437/8 |
| 5,317,255 | 5/1994 | Suyama et al. | 324/754 |
| 5,410,260 | 4/1995 | Kazama | 324/758 |

*Primary Examiner*—Ernest F. Karlsen
*Assistant Examiner*—Russell M. Kobert
*Attorney, Agent, or Firm*—Skjerven Morrill MacPherson Franklin & Friel; Thomas S. MacDonald

[57] ABSTRACT

Provided is a contact probe unit for establishing an electric contact between parts to be contacted and terminals of an external circuit. A plurality of needle members are slidably received individually in support holes provided in a support block. A resilient block is placed over the upper surface of the support block, and the needle members can be thereby engaged to the parts to be contacted with a suitable spring force. The electric contact between the upper ends of the needle members and the terminals of the external circuit may be achieved either directly or via a pressure sensitive electroconductive resilient block. The use of resiliently supported needle members ensures a high reliability and a high durability. Furthermore, a high dimensional precision on the pitch of the front ends of the needle members can be achieved without any difficulty.

13 Claims, 4 Drawing Sheets

5,798,655

CONTACT PROBE UNIT INCLUDING NEEDLE MEMBERS URGED BY A RESILIENT MATERIAL BLOCK

This application is a continuation of application Ser. No. 08/356,437, filed Dec. 15, 1994, now abandoned.

CROSS REFERENCE TO RELATED PATENTS AND CO-PENDING APPLICATIONS

The following patents and co-pending patent applications are directed to subject matters similar to those of the present application, and are commonly assigned to NHK Spring Co., Ltd. Reference should be made to the disclosure of these patents and patent applications, and the contents of the copending applications are hereby incorporated with the present application by reference.

| Application Number | Filing Date | Remarks |
|---|---|---|
| unknown | even date | |
| 08/148,488 | November 8, 1993 | U.S. Pat. No. 5,414,369 issued May 9, 1995 |
| 08/148,489 | November 8, 1993 | U.S. Pat. No. 5,410,260 issued April 25, 1995 |
| 08/013,465 | February 4, 1993 | U.S. Pat. No. 5,394,099 issued February 28, 1995 |
| 07/739,051 | July 30, 1991 | U.S. Pat. No. 5,200,695 issued April 6, 1993 |
| 07/737,763 | July 30, 1991 | U.S. Pat. No. 5,189,364 issued February 23, 1993 |
| 07/600,198 | October 19, 1990 | Div. of 07/536,516 U.S. Pat. No. 5,084,673 issued January 28, 1992 |
| 07/536,516 | June 12, 1990 | U.S. Pat. No. 5,003,255 issued March 26, 1991 |
| 07/424,511 | October 20, 1989 | U.S. Pat. No. 5,004,977 issued April 2, 1991 |

TECHNICAL FIELD

The present invention relates to a contact probe unit, and in particular to a contact probe unit which is suitable for testing LCD panels and arrays of electronic components including points to be tested arranged at a high density.

BACKGROUND OF THE INVENTION

Conventionally, contact probe units have been widely used for testing electroconductive patterns of printing circuit boards and various electronic devices, and there have been attempts to modify them into more suitable forms for testing LCD panels. It has been proposed to use an electroconductive rubber block 21 for establishing electric contacts between pads of a printed circuit board 22 and terminals 2a of a LCD panel 2 as illustrated in FIG. 5. This electroconductive rubber block 21 may include a large number of small gold-plated resin balls uniformly distributed therein at such a density that these balls are out of contact with each other in the natural condition of the rubber block 21, but are brought into contact with each other when pressure is applied to the rubber block 21. Thus, an electroconductive path is individually established between each of the terminals 2a of the LCD panel 2 and the corresponding terminal 22a of the printed circuit board 22 when the rubber block 21 is interposed between the printed circuit board 22 and the LCD panel 2, and the corresponding parts of the rubber block are compressed between the terminals 2a and 22a.

This structure is able to establish contacts with terminals arranged at an extremely small pitch with simple and economical structure. However, after this testing process has been repeated a large number of times, the rubber block 21 tends to lose resiliency, and needs to be replaced relatively frequently. Also, residues such as silicone from the rubber block may attach to the terminals of the LCD, and cause a failure in electric contact. Furthermore, the registration between the terminals of the printed circuit board and the terminals of the LCD panel cannot be visually confirmed, and is therefore difficult to accomplish in a satisfactory manner. Additionally, specially designed printed circuit boards are required to be prepared for each different type of LCD panels with respect to both X- and Y-coordinates.

Alternatively, as seen in FIG. 6 a flexible circuit board 25 may be attached to the lower surface of a securing plate 23 with a rubber plate 24 interposed between them so that the electrodes 25a of the flexible circuit board 25 may be resiliently pressed onto the corresponding terminals 22a of the LCD panel 22. However, the electrodes 25a of the flexible circuit board 25 tends to wear out relatively quickly, and there is a substantial difficulty in accomplishing proper registration between the electrodes 25a of the flexible circuit board 25 and the terminals 2a of the LCD panel 2. As with the previous example, special circuit boards are required to be prepared for each different type of LCD panels with respect to both X- and Y-coordinates.

The example of FIG. 6 may be slightly modified so as to use the combination of a TAB and a rubber mat. In this case also, the electrodes of-the TAB tends to wear out relatively quickly, and there is a difficulty in accomplishing a proper registration between the terminals of the TAB and the terminals 2a of the LCD panel 2.

As an additional example, (FIG. 7) it is possible to use a plurality of cantilever needle members 27 extending from a support plate 26, and contact the free ends of these cantilever needle members 27 with the corresponding terminals 2a of the LCD panel 2. In this case, the needle members 27 have to be formed into a complex shape, and therefore involve a relatively high fabrication cost. The needle members 27 are so fine and readily deformable that a special care is necessary for their handling.

According to the examples illustrated in FIGS. 5 and 6, it is difficult to achieve any precision in the pitch of the electroconductive paths, and these arrangements cannot be applicable where the pitch of the terminals is less than 200 micrometers. Similarly, the example of FIG. 7 cannot be applicable where the pitch of the terminals is less than 120 micrometers.

BRIEF SUMMARY OF THE INVENTION

In view of such problems of the prior art, a primary object of the present invention is to provide a contact probe unit which can be used on highly densely distributed parts to be tested.

A second object of the present invention is to provide a contact probe unit which can be easily registered with parts to be tested.

A third object of the present invention is to provide a contact probe unit which is simple in structure and durable in use.

These and other objects of the present invention can be accomplished by providing a contact probe unit for establishing an electric contact between parts to be contacted and terminals of an external circuit, comprising: a substantially rigid support block having a plurality of support holes passed between upper and lower surfaces of the support block; a plurality of needle members slidably received individually in the support holes, each of the needle members having a front end which projects from the lower surface of the support block in a rest condition, and a rear end which projects from the upper surface of the support block when the front end of the needle member is pushed onto a corresponding one of the parts to be contacted; and a resilient block made of a resilient material placed over the upper surface of the support block, the resilient material having a property to become electroconductive when compressed, each of the terminals of the external circuit being placed over an upper surface of the resilient block substantially in alignment with the rear end of a corresponding one of the needle members.

Alternatively, the objects of the present invention can be accomplished by providing a contact probe unit for establishing an electric contact between parts to be contacted and terminals of an external circuit, comprising: a substantially rigid support block having a plurality of support holes passed between upper and lower surfaces of the support block; a plurality of needle members slidably received individually in the support holes, each of the needle members having a front end which projects from a lower surface of the support block in a rest condition, and a rear end which projects from an upper surface of the support block when the front end of the needle member is pushed onto a corresponding one of the parts to be contacted; and a resilient block made of a resilient material placed over the upper surface of the support block, each of the terminals of the external circuit being interposed between the rear end of a corresponding one of the needle members and an upper surface of the resilient block.

Thus, the contact between the contact probe unit and the parts to be contacted or tested is effected by needle members which may have a desired rigidity and/or hardness, and a high reliability and a high durability can be accomplished. The resilient block applies a suitable spring force to each of the needle members, and a reliable contact can be thereby accomplished. Also, a high dimensional precision, in particular a high dimensional precision on the pitch of the front ends of the needle members, can be achieved without any difficulty.

According to a preferred embodiment of the present invention, to the end of forming a stable assembly, the resilient block is received in a recess provided on an upper surface of the support block so as to define a common upper surface with the support block, and a securing plate is placed over the common upper surface of the resilient block and the support block. Alternatively, a securing plate is placed over the support block, and the resilient block is received in a recess provided on lower surface of the securing plate so as to define a common lower surface with the securing plate.

When the resilient block is designed as a pressure-sensitive electroconductive resilient block, the resilient material may comprise a matrix consisting of a polymer material, and a multitude of particles having an electroconductive coating thereon and embedded in the matrix. These particles may for instance consist of gold-plated synthetic resin balls.

The present invention is particularly suitable for applications in testing LCD panels which are desired to have as densely arranged LCD cells as possible, and the input terminals therefor are typically highly densely arranged.

To the end of slidably retaining the needle members in corresponding support holes in a convenient manner, each of the needle members may be provided with a large diameter portion on an upper end thereof while each of the support holes is correspondingly provided with a small diameter portion in a lower end thereof so that the large diameter portion of the needle member rests on a shoulder surface defined at an upper end of the small diameter portion of the support hole to determine an extent by which the front end of the needle member projects from the lower surface of the support block in the rest condition.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
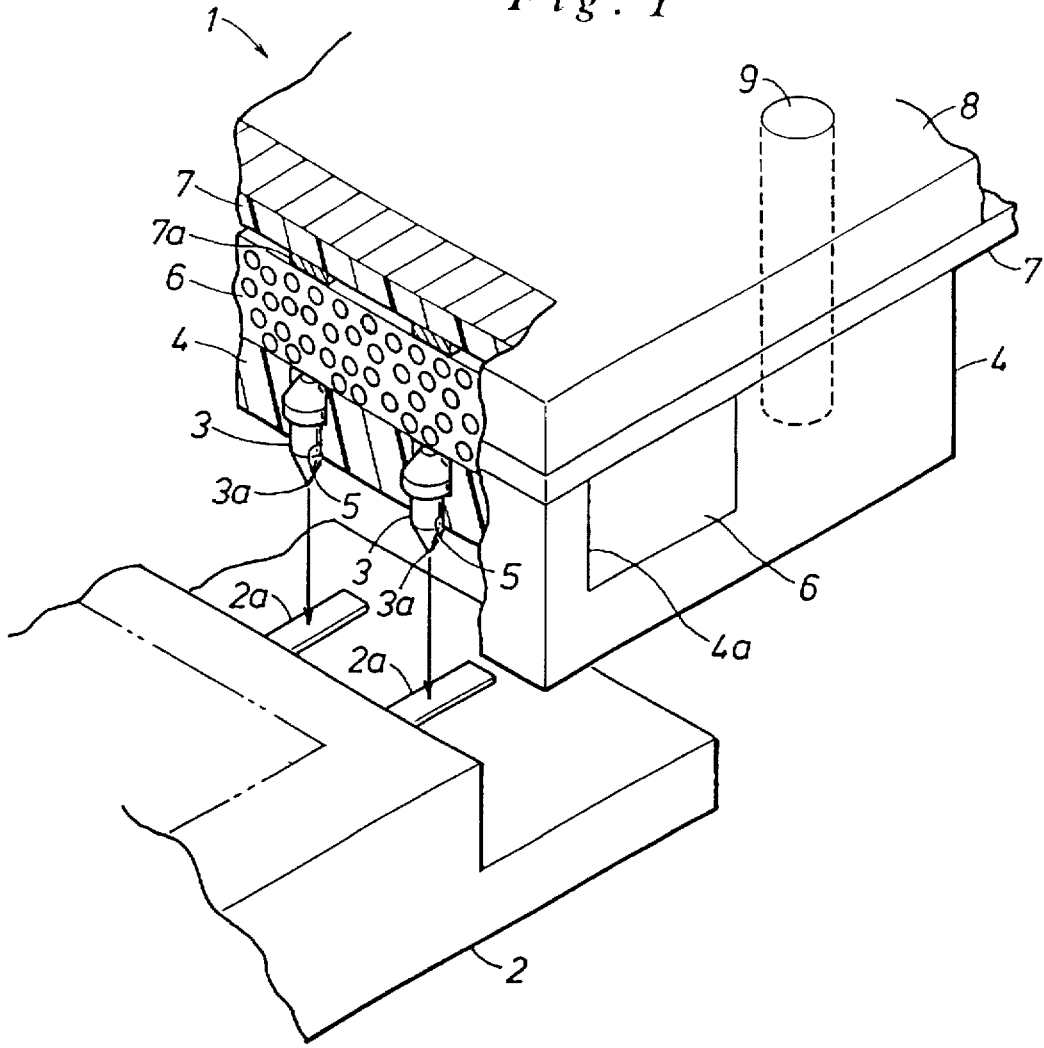
FIG. 1 is a broken-away perspective view of a first embodiment of the contact probe unit according to the present invention when the contact probe unit is about to be brought into contact with the input terminals of an LCD panel or the parts to be tested.

FIG. 1 is a broken-away perspective view of a contact probe unit 1 incorporating a multitude of contact probe modules according to the present invention. This contact probe unit 1 is adapted to test an LCD panel 2 by lighting up each of the cells in the LCD panel 2 prior to finally connecting the LCD panel 2 to a TAB serving as an LCD for driving the LCD panel 2. In FIG. 1 and in the following drawings, some of the parts are enlarged for illustrative purpose, and are therefore not shown to scale.

Referring to FIG. 1, the contact probe unit 1 comprises a multitude of electroconductive needle members 3, and a support block 4 serving as a holder for these needle members 3. The support block 4 consists of an electrically insulating plate, and is provided with a laterally elongated slot 4a on its upper surface. A plurality of support holes 5 are passed through the bottom wall of this slot 4a. Each of the needle members 3 is slidably received in the corresponding support hole 5. These support holes 5 may be arranged in a single row or a plurality of mutually staggered rows.

The internal end or upper end of each of the needle members 3 has a large diameter portion, and each of the support holes 5 has a corresponding large diameter portion in a corresponding end thereof. Thus, each of the needle members 3 is prevented from coming off from the support hole 5 with the large diameter portion of the needle member 3 resting on an annular shoulder surface defined at the lower end of the large diameter portion of the support hole 5, and the lower end 3a of the needle member 3 projects from the lower surface of the support block 4. The lower end 3a of each of the needle members 3 is formed as a sharply pointed end. The upper end of each of the needle members 3 may either project from the upper surface of the bottom wall of the slot 4a or remain hidden in the corresponding support hole 5 in the rest condition. When in use, the pointed lower ends 3a are brought into contact with parts to be tested, in this instance, consisting of connecting electrodes 2a, and this in turn causes the upper ends of the needle members 3 to substantially project from the upper surface of the bottom wall of the slot 4a.

An electroconductive rubber block 6 is fitted in the lateral slot 4a, and the upper surface of the electroconductive rubber block 6 lies on a same plane as the upper surface of the remaining part of the support block 4. A testing TAB 7 is embedded in or attached to a suitable synthetic resin securing plate 8, and is sandwiched between the common upper surface of the electroconductive rubber block 6 the support block 4, and the securing plate 8. Terminals 7a consisting of a printed electroconductive pattern formed on the securing plate 8 or the testing TAB 7 itself are placed in contact with the upper surface of the electroconductive rubber block 6 with each terminal 7a aligned with an associated one of the support holes 5. The securing plate 8 is accurately registered with the support block 4 by means of a plurality of locating pins 9 although only one of them is illustrated in FIG. 1.

The anisotropic electroconductive rubber block 6 may consist of a rubber plate containing a large number of gold plated resin balls 10 having a diameter in the order of 10 μm evenly distributed therein. The density of the gold plated resin balls 10 is selected in such a manner that the resin balls 10 are substantially not in contact with each other under the natural condition. In the state illustrated in FIG. 1, this rubber block 6 may abut the rear ends of the needle members 3, and urge the needle members 3 in downward direction.

Figure 2:
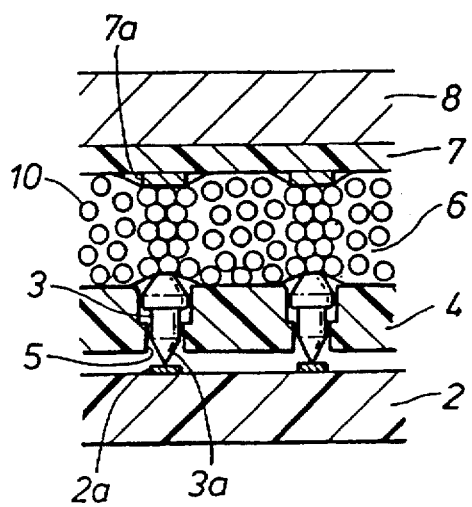
FIG. 2 is a sectional view of an essential part of the contact probe unit of FIG. 1 when the needle members are fully brought into contact with the input terminals of the LCD panel.

When in use or when the forward ends 3a of the needle members 3 are pushed against the corresponding parts to be tested 2a, the rear ends of the needle members 3 are pushed into the resilient rubber block 6 as illustrated in FIG. 2. As a result, the parts of the rubber block 6 located above the needle members 3 are compressed by the pressure from the rear ends of the needle members 3, and the gold plated resin balls 10 are brought into contact with each other so that each of the needle members 3 become electrically connected to the associated terminal 7a via the gold plated resin balls 10. Because the rubber block 6 resiliently urges the needle members 3 toward the terminals 2a, a favorable electric contact can be established between the terminals 2a and the needle members 3.

According to this contact probe unit 1, because the TAB 7 can be attached to the securing plate 8 at a high precision, and the securing plate 8 in turn can be accurately positioned relative to the support block 4 with the aid of the locating pins 9, it is possible to register the needle members 3 with the terminals 7a at a high precision relatively easily. The TAB securing plate 8 can be simply attached to the support plate 4 simply with screws, and can be readily dissembled when the TAB 7 or the electroconductive rubber block 6 is required to be replaced. Because the needle members 3 and the terminals 7a of the TAB 7 are not required to be in direct contact, the TAB 7 is relatively protected from any impact arising from the contact between the needle members 3 and the terminals 2a of the LCD panel 2.

Figure 3:
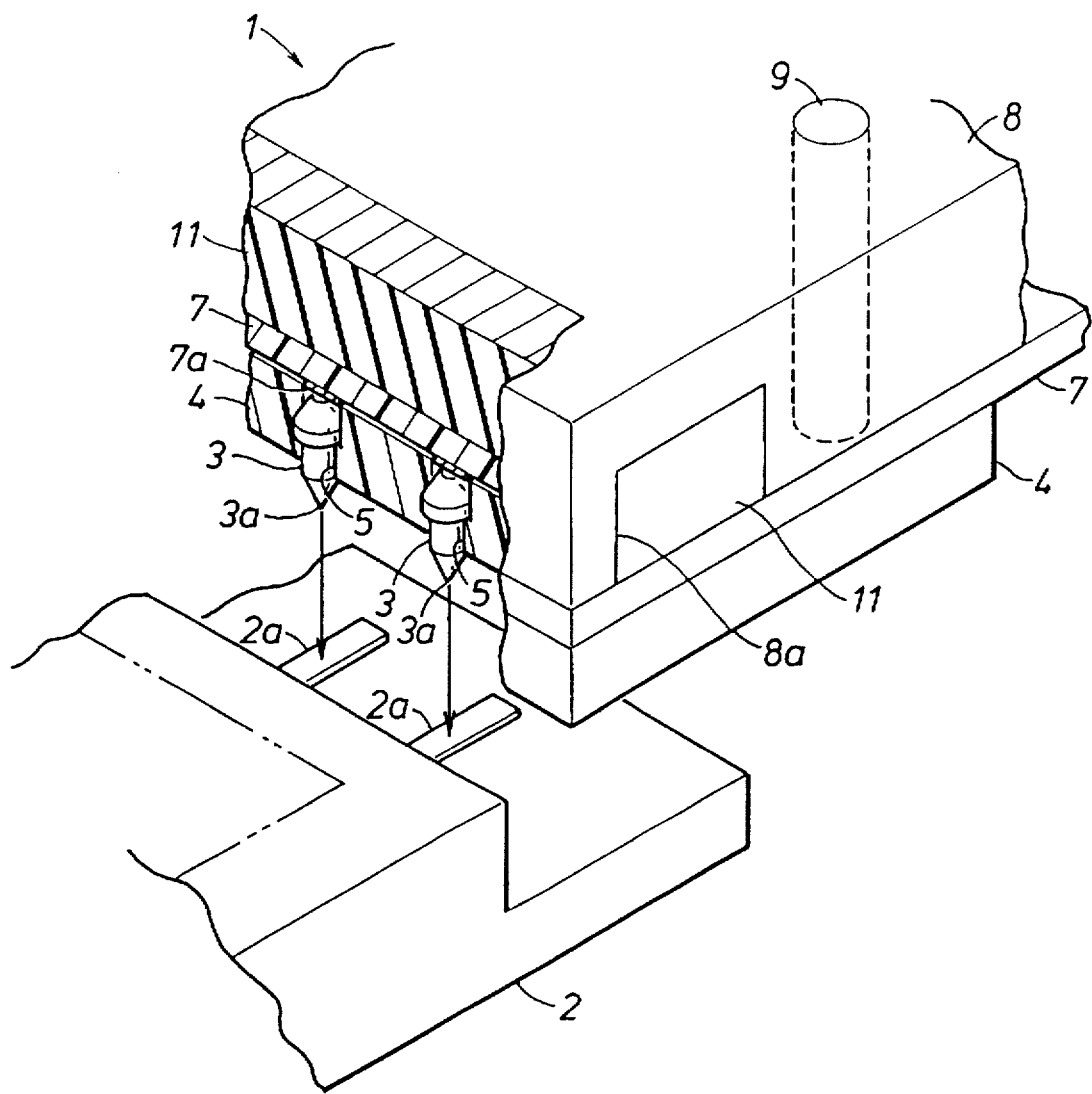
FIG. 3 is a view similar to FIG. 1 showing a second embodiment of the present invention.
Figure 4:
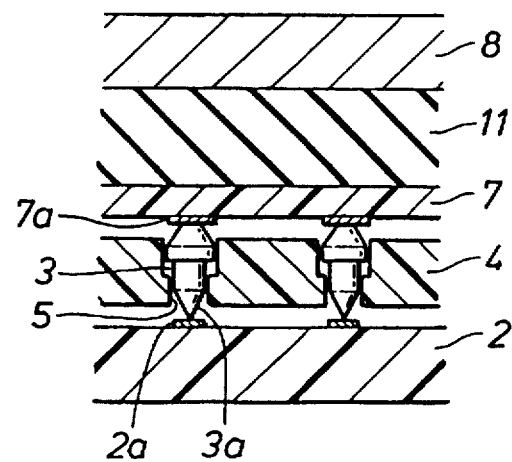
FIG. 4 is a view similar to FIG. 2 showing the second embodiment of the present invention.
Figure 5:
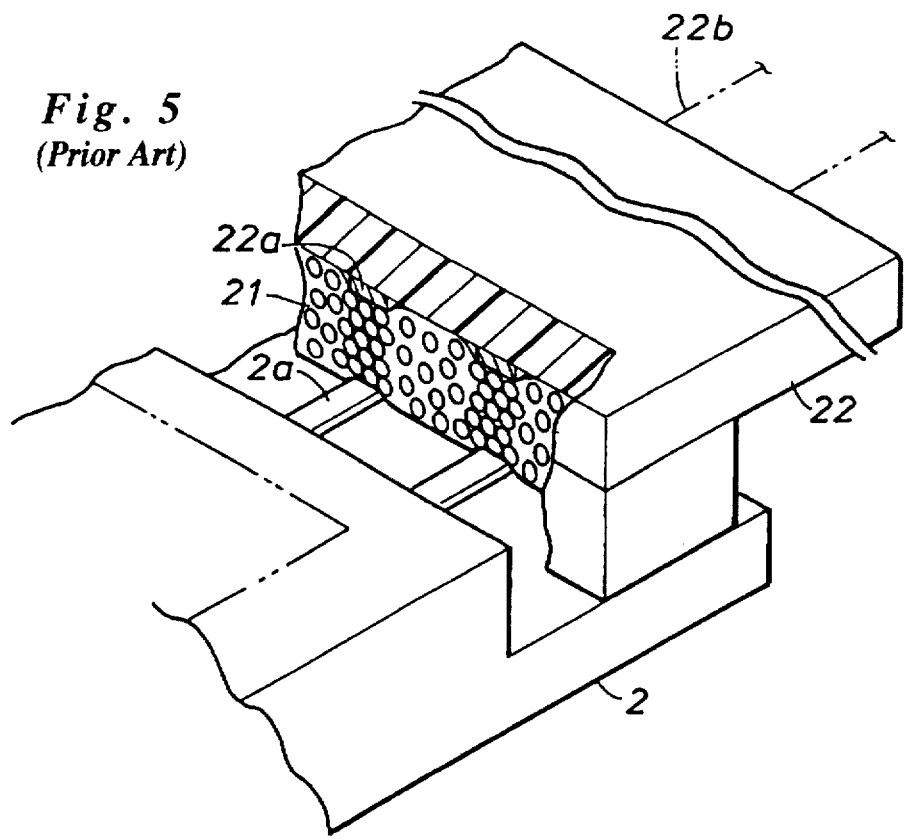
FIGS. 5 and 6 are broken-away perspective views of previously conceived contact probe units.
Figure 6:
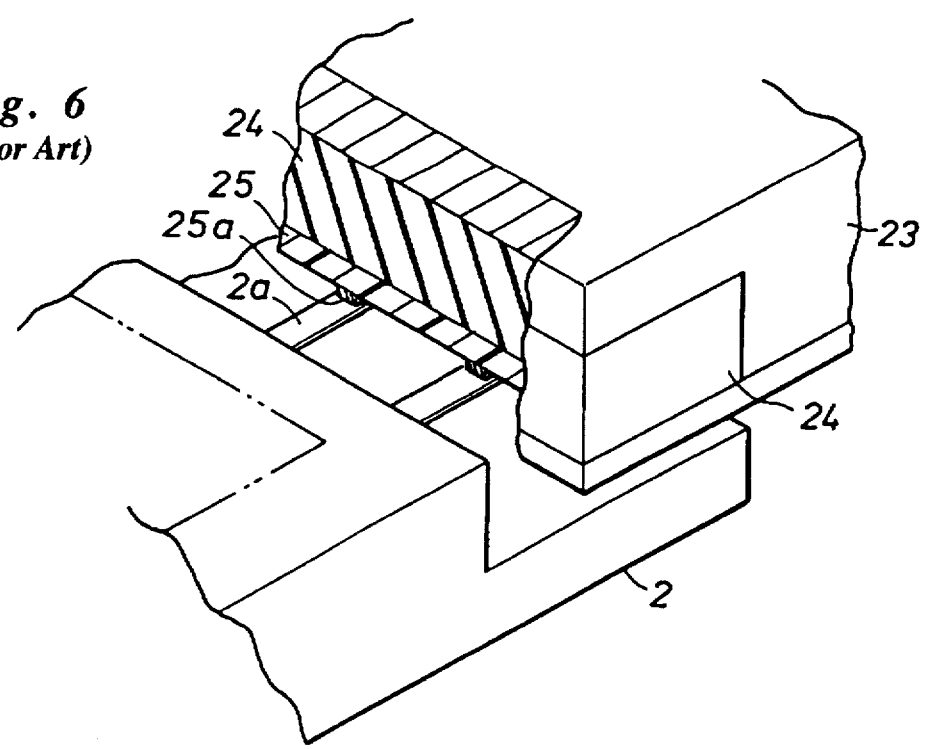
Figure 7:
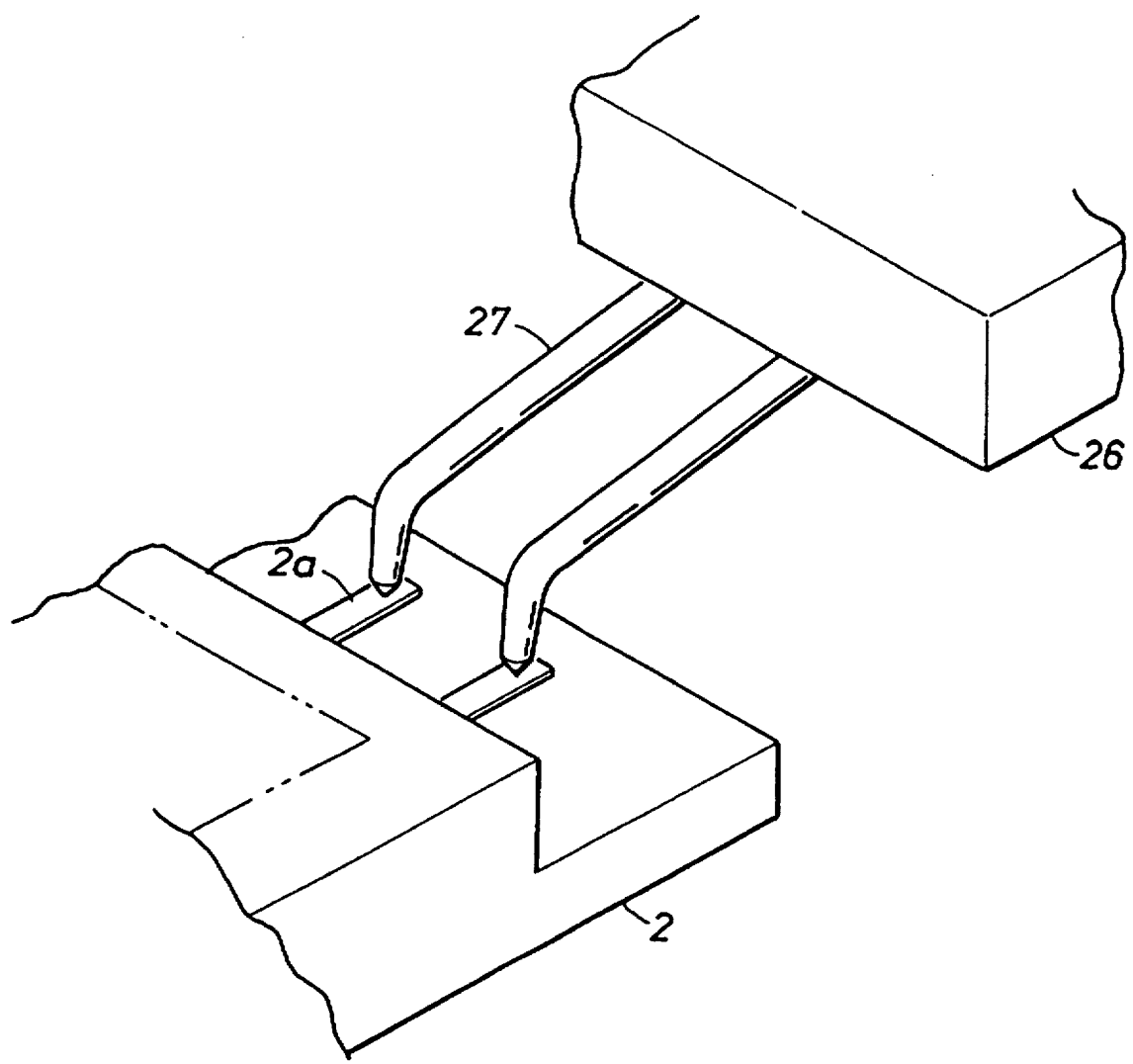
FIG. 7 is a perspective view of yet another previously conceived contact probe unit.

FIGS. 3 and 4 show a second embodiment of the present invention, and in these drawings the parts corresponding to those of the previous embodiment are denoted with like numerals.

In the second embodiment, the TAB 7 is placed over the support block 4, and the TAB securing plate 8 is placed over the TAB 7 via a rubber block 11. The rear or the upper ends of the needle members 3 can directly abut the terminals 7a of the TAB 7. The rubber block 11 is received in a laterally extending slot 8a provided in the lower surface of the TAB securing plate 8.

In the rest condition illustrated in FIG. 3, the rear ends of the needle members 3 are resiliently biased by the rubber block 11, and the front ends or the lower ends 3a of the needle members 3 project from the lower end of the support holes 5 of the support block 4. When in use, the support block 4 is lowered until the free ends of the needle members 3 abut the terminals 2a of the LCD panel 2. As a result, the needle members 3 are pushed back into the rubber block 11 against the elastic resistance of the rubber block 11. Thus, a favorable electric contact can be established between the terminals 2a of the LCD panel 2 and the needle members 3 as well as between the needle members 3 and the terminals 7a of the TAB 7. Thus, all the cells of the LCD panel 2 can be lighted up by supplying suitable electric signals to the terminals 2a.

This embodiment also provides the facility in the positioning of the TAB 7, and the maintenance of the contact probe unit. Furthermore, the electroconductive paths between the needle members 3 and the terminals 7a of the TAB 7 is relatively direct without involving any parts involving a relatively large electric resistance, and a favorable electroconductive property can be easily ensured.

In either one of these embodiments, a standard TAB identical to those used in actually driving LCD panels in the final products can be used for testing the LCD panels, and no special printed circuit boards for testing purpose is required. Thus, a practical test can be accomplished without requiring any complex testing equipment. The rubber blocks 6 and 11 used in the above described embodiments may be substituted by any material as long as it has a suitable resiliency and/or pressure sensitive electroconductive property, and may for instance consist of foamed synthetic resin materials. It is also possible to provide a recess in the part of the TAB securing plate located right behind the TAB, and use the resiliency of the TAB itself as spring means for urging the needle members onto the parts to be tested.

Thus, according to the present invention, in spite of its simple structure, needle members having a high rigidity can be applied to the parts to be tested. Therefore, the contact probe unit of the present invention can be made more durable as compared to the previously conceived structures using electroconductive rubber and electroconductive printed patterns of flexible printed circuit boards. In particular, because no compression coil springs are required, a large number of needle members can be arranged in a limited area simply by forming support holes at a required density. Furthermore, even though no compression coil springs are used for urging the needle members, the rubber blocks can provide a favorable biasing force for the needle members.

Although the present invention has been described in terms of preferred embodiments thereof, it is obvious to a person skilled in the art that various alterations and modifications are possible without departing from the scope of the present invention which is set forth in the appended claims.

What we claim is:

1. A contact probe unit for establishing an electric contact between parts to be contacted and terminals of an external circuit, comprising:

a substantially rigid support block having a plurality of support holes passed between upper and lower surfaces of said support block;

a plurality of needle members slidably received individually in said support holes, each of said needle members having a front end which projects from said lower surface of said support block in a rest condition, and a rear end which projects from said upper surface of said support block when said front end of said needle member is pushed onto a corresponding one of said parts to be contacted;

a resilient block made of a resilient material placed over said upper surface of said support block, said resilient material having a property to become electroconductive when compressed, each of said terminals of said external circuit being placed over an upper surface of said resilient block substantially in alignment with the rear end of a corresponding one of said needle member;

wherein each of said needle members is provided with a large diameter portion on an upper end thereof, and each of said support holes is correspondingly provided with a small diameter portion in a lower end thereof so that said large diameter portion of said needle member rests on a shoulder surface defined at an upper end of said small diameter portion of said support hole to determine an extent by which said front end of said needle member projects from said lower surface of said support block in the rest condition; and wherein the rear ends of said needle members in use are pushed into the resilient block and said resilient block resiliently urges the front ends of the needle members into direct electrical contact with the parts to be contacted.

2. A contact probe unit according to claim 1, wherein said resilient block is received in a recess provided on an upper surface of said support block so as to define a common upper surface with said support block, and a securing plate is placed over said common upper surface of said resilient block and said support block.

3. A contact probe unit according to claim 1, wherein said resilient material comprises a matrix consisting of a polymer material, and a multitude of particles having an electroconductive coating thereon and embedded in said matrix.

4. A contact probe unit according to claim 1, wherein said parts to be contacted consist of input terminals of an LCD panel, and said external circuit consists of a TAB.

5. A contact probe unit according to claim 1 wherein said needle members are one-piece electroconductive needles without compression coil springs and wherein the front ends of the needle members each include a portion of a diameter greater than a diameter of the rear ends and said support holes include an annular shoulder surface on which said front end portions rest.

6. A contact probe unit for establishing an electric contact between parts to be contacted and terminals of an external circuit, comprising:

a substantially rigid support block having a plurality of support holes passed between upper and lower surfaces of said support block;

a plurality of needle members slidably received individually in said support holes, each of said needle members having a front end which projects from a lower surface of said support block in a rest condition, and a rear end which projects from an upper surface of said support block when said front end of said needle member is pushed onto a corresponding one of said parts to be contacted;

a resilient block made of a resilient material placed over said upper surface of said support block, each of said terminals of said external circuit being interposed behind the rear end of a corresponding one of said needle members and on a surface of said resilient block;

wherein said resilient block urges the front end of said needles into electrical direct contact with the parts to be contacted; and wherein each of said needle members is provided with a large diameter portion on an upper end thereof, and each of said support holes is correspondingly provided with a small diameter portion in a lower end thereof so that said large diameter portion of said needle member rests on a shoulder surface defined at an upper end of said small diameter portion of said support hole to determine an extent by which said front end of said needle member projects from said lower surface of said support block in the rest condition.

7. A contact probe unit according to claim 6, wherein said parts to be contacted consist of input terminals of an LCD panel, and said external circuit consists of a TAB.

8. A contact probe unit according to claim 7 wherein said TAB includes terminals which seat directly on said needle members.

9. A contact probe unit according to claim 6, wherein said terminals of said external circuit are formed on a circuit board which is placed over a lower surface of said resilient block.

10. A contact probe unit according to claim 6; wherein a securing plate is placed over said support block, and said resilient block is received in a recess provided on lower surface of said securing plate so as to define a common lower surface with said securing plate.

11. A contact probe unit according to claim 6 wherein said terminals of said external circuit are formed on a circuit board which is placed over an upper surface of said resilient block.

12. A contact probe unit according to claim 11 wherein said resilient block has a property to become electroconductive when compressed and wherein the resultant compression results in an electrical connection between said external circuit and a selected needle member.

13. A contact probe unit according to claim 6 wherein said needle members are one-piece electroconductive needles without compression coil springs and wherein the front ends of the needle members each include a portion of a diameter greater than a diameter of the rear ends and said support holes include an annular shoulder surface on which said front end portions rest.

* * * * *